US008363307B2

(12) United States Patent
McCarthy et al.

(10) Patent No.: US 8,363,307 B2
(45) Date of Patent: Jan. 29, 2013

(54) MULTICOLOR LIGHT EMITTING DEVICE INCORPORATING TUNABLE QUANTUM CONFINEMENT DEVICES

(75) Inventors: Wil McCarthy, Lakewood, CO (US); Richard M. Powers, Lakewood, CO (US)

(73) Assignee: Ravenbrick, LLC, Denver, CO (US)

( * ) Notice: Subject to any disclaimer, the term of this patent is extended or adjusted under 35 U.S.C. 154(b) by 1146 days.

(21) Appl. No.: 12/038,677

(22) Filed: Feb. 27, 2008

(65) Prior Publication Data

US 2008/0204383 A1 Aug. 28, 2008

Related U.S. Application Data

(60) Provisional application No. 60/892,152, filed on Feb. 28, 2007.

(51) Int. Cl.
*G02F 1/35* (2006.01)
*G02F 2/02* (2006.01)
*H01S 3/10* (2006.01)

(52) U.S. Cl. ............... 359/326; 257/89; 257/98; 372/20
(58) Field of Classification Search ................ None
See application file for complete search history.

(56) References Cited

U.S. PATENT DOCUMENTS

| | | |
|---|---|---|
| 5,013,918 A | 5/1991 | Choi |
| 5,212,584 A | 5/1993 | Chung |
| 5,274,246 A | 12/1993 | Hopkins et al. |
| 5,347,140 A | 9/1994 | Hirai et al. |
| 5,530,263 A | 6/1996 | DiVincenzo |
| 5,585,640 A | 12/1996 | Huston et al. |
| 5,757,828 A | 5/1998 | Ouchi |
| 5,763,307 A | 6/1998 | Wang et al. |
| 5,881,200 A | 3/1999 | Burt |
| 5,889,288 A | 3/1999 | Futatsugi |
| 5,937,295 A | 8/1999 | Chen et al. |
| 6,040,859 A | 3/2000 | Takahashi |
| 6,240,114 B1 | 5/2001 | Anselm et al. |

(Continued)

FOREIGN PATENT DOCUMENTS

| | | |
|---|---|---|
| EP | 0851506 | 7/1998 |
| EP | 1198008 | 4/2002 |

(Continued)

OTHER PUBLICATIONS

Black, C.T., et al., "Integration of self-assembled diblock copolymers for semiconductor capacitor fabrication," Applied Physics Letters, vol. 79, No. 3 (Jul. 16, 2001), pp. 409-411, (American Inst. of Physics, NY).

(Continued)

*Primary Examiner* — Hemang Sanghavi
(74) *Attorney, Agent, or Firm* — Dorsey & Whitney LLP

(57) ABSTRACT

A multicolor light emitting optical device is a programmable, multifunctional, general-purpose, solid-state light source. The device can use any of several light sources, including LEDs. The device couples a light source and a tunable optical converter composed of a quantum confinement device to produce a tunable, monochromatic light emission. The output wavelength of the optical device can be selected from within a tunable range of the optical (visible, near infrared, or near ultraviolet) spectrum on demand, in real time. The optical device is capable of serving as a tunable light source, a "true color" pixel, and a replacement for bi-color, tri-color, and multi-color light-emitting diodes. The optical device has particular, but not exclusive, application as an indicator light, in room lighting, and as a picture element in video displays.

8 Claims, 5 Drawing Sheets

U.S. PATENT DOCUMENTS

| | | | |
|---|---|---|---|
| 6,281,519 | B1 | 8/2001 | Sugiyama et al. |
| 6,294,794 | B1 | 9/2001 | Yoshimura et al. |
| 6,304,784 | B1 | 10/2001 | Allee et al. |
| 6,320,220 | B1 | 11/2001 | Watanabe et al. |
| 6,329,668 | B1 | 12/2001 | Razeghi |
| 6,333,516 | B1 | 12/2001 | Katoh et al. |
| 6,437,361 | B1 | 8/2002 | Matsuda |
| 6,487,112 | B1 | 11/2002 | Wasshuber |
| 6,498,354 | B1 | 12/2002 | Jefferson et al. |
| 6,512,242 | B1 | 1/2003 | Fan et al. |
| 6,600,169 | B2 | 7/2003 | Stintz et al. |
| 6,611,640 | B2 | 8/2003 | LoCasclo et al. |
| 6,635,898 | B2 | 10/2003 | Williams et al. |
| 6,661,022 | B2 | 12/2003 | Morie et al. |
| 6,718,086 | B1 | 4/2004 | Ford et al. |
| 6,753,273 | B2 | 6/2004 | Holonyak, Jr. et al. |
| 6,770,916 | B2 | 8/2004 | Ohshima |
| 6,777,718 | B2 | 8/2004 | Takagi |
| 6,816,525 | B2 | 11/2004 | Stintz et al. |
| 6,847,662 | B2 | 1/2005 | Bouda et al. |
| 6,946,697 | B2 | 9/2005 | Pietambaram et al. |
| 6,978,070 | B1 | 12/2005 | McCarthy et al. |
| 7,026,641 | B2 | 4/2006 | Mohseni et al. |
| 7,318,651 | B2 * | 1/2008 | Chua et al. ............. 362/11 |
| 7,470,925 | B2 | 12/2008 | Tamura et al. |
| 7,601,946 | B2 | 10/2009 | Powers et al. |
| 7,768,693 | B2 | 8/2010 | McCarthy et al. |
| 2002/0080842 | A1 | 6/2002 | An et al. |
| 2002/0152191 | A1 | 10/2002 | Hollenberg et al. |
| 2002/0190249 | A1 | 12/2002 | Williams et al. |
| 2003/0059998 | A1 | 3/2003 | Holonyak et al. |
| 2003/0066998 | A1 | 4/2003 | Lee |
| 2003/0107927 | A1 | 6/2003 | Yerushalmi et al. |
| 2004/0256612 | A1 | 12/2004 | Mohseni et al. |
| 2005/0157996 | A1 | 7/2005 | McCarthy et al. |
| 2005/0157997 | A1 | 7/2005 | McCarthy et al. |
| 2005/0271092 | A1 * | 12/2005 | Ledentsov et al. ............. 372/20 |
| 2006/0011904 | A1 | 1/2006 | Snyder et al. |
| 2006/0049394 | A1 | 3/2006 | Snyder et al. |
| 2006/0151775 | A1 | 7/2006 | Hollenberg et al. |
| 2008/0246388 | A1 * | 10/2008 | Cheon et al. .................. 313/501 |
| 2010/0051898 | A1 * | 3/2010 | Kim et al. ..................... 257/9 |
| 2011/0205650 | A1 | 8/2011 | Powers et al. |

FOREIGN PATENT DOCUMENTS

| | | |
|---|---|---|
| GB | 2261989 | 11/1991 |
| JP | 10-260381 | 9/1998 |
| JP | 2003-248204 | 9/2003 |
| KR | 10-2002-0013986 | 2/2002 |
| WO | WO 98/53504 | 11/1998 |

OTHER PUBLICATIONS

Goldhaber-Gordon, David, et al., "Overview of Nanoelectronic Devices," Proceedings of the IEEE, vol. 85, No. 4, (Apr. 1997) pp. 521-533.

Kastner, Marc A., "Artificial Atoms," Physics Today (Jan. 1993), American Institute of Physics.

Kouwenhoven, Leo, et al., "Quantum Dots," Physics World, (Jun. 1988), pp. 35-39.

Leatherdale, C.A., et al., "Photoconductivity in CdSe Quantum Dot Solids," Physical Review B, vol. 62, No. 4, (Jul. 15, 2000) pp. 2669-2680.

McCarthy, Wil, "Once Upon a Matter Crushed," Science Fiction Age (Jul. 1999).

McCarthy, Wil, "Programmable Matter," Nature, vol. 407 No. 127, (Oct. 5, 2000).

McCarthy, Wil, "The Collapsium," Orion Books (2000).

Ryu, Du Yeol et al., "A Generalized Approach to the Modification of Solid Surfaces," Science, vol. 308 (Apr. 8, 2005), pp. 236-239.

Soh, Hyongsok T. et al., "Scanning Probe Lithography," Ch. 3, (2001) pp. 44-66 (Kluwer Academic Publishers).

Turton, Richard, "The Quantum Dot: A Journey into the Future of Microelectronics," Oxford University Press (1995).

Xu, Ting et al., "The Influence of Molecular Weight on Nanoporous Polymer Films," Polymer, 42 (Apr. 3, 2001), pp. 9091-9095 (Elsevier Science Ltd).

International Searching Authority; Korean Intellectual Property Office; Written Opinion of the International Searching Authority (Form PCT/ISA/237) for International application No. PCT/US2008/055316; Jun. 26, 2008; 6 pages.

International Searching Authority; Korean Intellectual Property Office; International Search Report (Form PCT/ISA/210) for International application No. PCT/US2008/055316; Jun. 26, 2008; 3 pages.

Orlov, Alexei O., et al., Clocked Quantum-Dot Cellular Automata Devices: Experimental Studies, IEEE-NANO 2001, Oct. 30, 2001, pp. 425-430.

\* cited by examiner

MULTICOLOR LIGHT EMITTING DEVICE INCORPORATING TUNABLE QUANTUM CONFINEMENT DEVICES

CROSS REFERENCE TO RELATED APPLICATIONS

This application claims the benefit of priority pursuant to 35 U.S.C. §119(e) of U.S. provisional application No. 60/892,152 filed 28 Feb. 2007 entitled "Multicolor light emitting device incorporating tunable quantum confinement devices," which is hereby incorporated herein by reference in its entirety.

This application is related to U.S. Pat. No. 6,978,070 B1 and its divisional application Ser. Nos. 11/081,777 and 11/081,778 (now U.S. Pat. No. 7,276,432), and to U.S. patent application Ser. Nos. 11/144,326, 11/145,417, and 11/676,785, each of which is hereby incorporated herein by reference. This application is also related to U.S. provisional patent application Nos. 60/825,385 and 60/825,405, each of which is hereby incorporated herein by reference.

BACKGROUND

This technology relates to a device for producing light in a variety of colors. The device incorporates light-emitting diodes and optical frequency converters. The technology has particular, but not exclusive, application in display technology, as a single pixel capable of displaying monochromatic light at a selectable wavelength.

The infrared light emitting diode (LED) was invented by Robert Biard and Gary Pittman in 1961. The visible (red) LED was invented by Nick Holonyak in 1962. LEDs of all colors have been employed in a wide variety of applications for decades, are well understood and documented in the prior art, and need no further elaboration here, except to note that the light emitted by LEDs is generally monochromatic, i.e., it is emitted in a narrow range of wavelengths.

Bi-color and tri-color LEDs also exist, but these are simply multiple monochromatic LEDs arranged in a vertical stack. For example, an LED with independently switchable red and green components can appear not only red or green, but also "orange" when both the red and green components are activated. In this case, the orange color is an illusion resulting from the combination of red and green light. Similarly, full-color LED displays rely on pixels consisting of three different color LED's (usually red, green, and blue, although other combinations are also known to work) which, by being activated with different intensities, produce the illusion of other colors in the human visual range.

The conversion between different wavelengths of light is also well understood in the prior art, and can be accomplished, for example, through the fluorescence of many manmade or naturally occurring materials. Semiconductor materials in particular are understood to fluoresce at a wavelength determined by their bandgap energy, producing a strong, narrow emission peak. Other materials, including phosphorus, fluoresce across many wavelengths. Some colored LEDs are constructed by placing an optical converter in the path of the LED's light output so that, for example, blue light is absorbed and re-radiated as white light (or "approximately white") when it strikes a converter made of phosphorus.

The fabrication of very small structures to exploit the quantum mechanical behavior of charge carriers, e.g., electrons or electron "holes" is also well established. Quantum confinement of a carrier can be accomplished by a structure whose dimension is less than the quantum mechanical wavelength of the carrier. Confinement in a single dimension produces a "quantum well," and confinement in two dimensions produces a "quantum wire."

A "quantum dot" is a structure capable of confining carriers in all three dimensions. Quantum dots can be formed as particles, with a dimension in all three directions of less than the de Broglie wavelength of a charge carrier. Quantum confinement effects may also be observed in particles of dimensions less than the electron-hole Bohr diameter, the carrier inelastic mean free path, and the ionization diameter, i.e., the diameter at which the charge carrier's quantum confinement energy is equal to its thermal-kinetic energy. It is postulated that the strongest confinement may be observed when all of these criteria are met simultaneously. Such particles may be composed of semiconductor materials (for example, Si, GaAs, AlGaAs, InGaAs, InAlAs, InAs, and other materials) or of metals, and may or may not possess an insulative coating. Such particles are referred to in this document as "quantum dot particles."

A quantum light emitting diode (QLED) is constructed by placing, in the output path of an LED, an optical converter incorporating quantum dot particles. Because the effective bandgap of a quantum dot particle is equal to the material bandgap plus the quantum confinement energy, and because the quantum confinement energy is a function of the size, shape, and composition of the quantum dot particles, it is possible to adjust the converter to fluoresce at nearly any wavelength of visible or infrared light by adjusting these properties at the time of manufacture, or to fluoresce at a variety of wavelengths simultaneously, by incorporating quantum dots of multiple types.

However, a quantum dot can also be formed inside a semiconductor substrate through electrostatic confinement of the charge carriers. This is accomplished through the use of microelectronic devices of various design, e.g., an enclosed or nearly enclosed gate electrode formed on top of a quantum well. Here, the term "micro" means "very small" and usually expresses a dimension of or less than the order of microns (thousandths of a millimeter). The term "quantum dot device" refers to any apparatus capable of generating a quantum dot in this manner. The generic term "quantum dot," abbreviated "QD" in certain of the drawings herein, refers to the confinement region of any quantum dot particle or quantum dot device.

The optical properties of a material depend on the structure and excitation level of the electron clouds surrounding its atoms and molecules. Quantum dots can have a greatly modified electronic structure from the corresponding bulk material, and therefore different properties. Because of their unique properties, quantum dots are used in a variety of electronic, optical, and electro-optical devices. Quantum dots are currently used as near-monochromatic fluorescent light sources, laser light sources, light detectors including infra-red detectors, and highly miniaturized transistors, including single-electron transistors. They can also serve as a useful laboratory for exploring the quantum mechanical behavior of confined carriers. Many researchers are exploring the use of quantum dots in artificial materials, and as dopants to affect the optical and electrical properties of semiconductor materials.

The embedding of metal and semiconductor nanoparticles inside bulk materials (e.g., the lead particles in leaded crystal) has occurred for centuries. However, an understanding of the physics of these materials has only been achieved comparatively recently. These nanoparticles are quantum dots with characteristics determined by their size and composition. These nanoparticles serve as dopants for the material in which they are embedded to alter selected optical or electrical properties. The "artificial atoms" represented by these quantum dots have properties which differ in useful ways from those of natural atoms. However, it must be noted that the doping characteristics of these quantum dots are fixed at the time of manufacture and cannot be adjusted thereafter.

A single-electron transistor (SET) is a type of switch which relies on quantum confinement. The SET comprises a source (input) path leading to a quantum dot particle or quantum dot device and a drain (output) path exiting, with a gate electrode controlling the dot. With the passage of one electron through the gate path into the device, the switch converts from a conducting or closed state to a nonconducting or open state, or vice-versa.

Semiconductors are capable of serving in optical converters in several ways. The emission wavelength of a fluorescent semiconductor is a function of its bandgap—a material-specific quantity. For photons with energies below the bandgap, the semiconductor is generally transparent, although material-specific absorption bands may also exist. Photons with energies higher than the bandgap absorbed and create electron-hole pairs within the semiconductor. Thus, a material like gallium arsenide (bandgap 1.424 eV) will fluoresce at a wavelength of 871 nanometers.

However, the energy of an electron confined in a quantum well is not only a function of bandgap, but of the quantum confinement energy, which depends on the thickness of the well and the energy height of the surrounding barriers (i.e., the difference in conduction band energy between the well and barrier materials). This "bandgap plus quantum confinement" energy moves the transparency of the material into shorter wavelengths. Thus, while a bulk GaAs sample fluoresces at approximately 870 nm, a 10 nm GaAs quantum well surrounded by $Al_{0.4}Ga_{0.6}As$ barriers has a 34 meV quantum confinement energy and thus shows the same emission peak at approximately 850 nm. Therefore, for a given set of materials and a given reference temperature, the cutoff energy can be fixed precisely through the fabrication of a quantum well of known thickness. It should be noted, however, that the bandgap is a temperature-dependent quantity. As the temperature of a semiconductor decreases, its bandgap increases slightly, and its emission wavelength decreases. When the semiconductor is heated, the bandgap decreases and the emission wavelength increases.

The information included in this Background section of the specification, including any references cited herein and any description or discussion thereof, is included for technical reference purposes only and is not to be regarded as subject matter by which the scope of the invention is to be bound.

SUMMARY

The technology disclosed herein is directed to the use of tunable quantum confinement devices as optical converters to alter the output wavelength of a light-emitting device. Quantum-confined carriers have the ability to serve as dopants within the surrounding material and the functionality of the optical converter arises as a consequence of the resulting changes in the optical properties of the filter material. A multicolor light-emitting (MLE) optical device may comprise two main components: an ordinary LED or other light-emitting device and an optical converter incorporating tunable quantum confinement devices.

In one implementation, the LED in the MLE device is a near-ultraviolet LED. Although this produces light output invisible to the human eye, it is beneficial in that it can be used to stimulate fluorescence at any visible or near-infrared wavelength. However, light-emitting devices of longer output wavelengths, including, for example, monochromatic sources (e.g., LEDs or lasers) or polychromatic, white, nearly white, or other multicolored sources (e.g., light bulbs, fluorescent light bulbs, halogen lights, arc lights, or lime lights) (hereinafter collectively, "polychromatic" sources), may be used instead without altering the essential functioning of the device.

In one implementation, the optical converter may be a layered composite film incorporating quantum dots as programmable dopants. However, a variety of other tunable quantum confinement devices may be employed as optical converters instead, without altering the essential function of the present invention.

In the MLE device, light (e.g., ultraviolet light) is emitted by the LED and passes through the optical converter, whose optical properties have been adjusted through external signals such that it fluoresces at a particular desired wavelength. When the optical converter is adjusted such that the effective bandgap of the quantum confinement device changes, the fluorescence wavelength of the optical converter also changes and therefore the output color of the LED is altered. Thus, the MLE device is capable of producing light at any desired wavelength within its tunable mutlicolor range, on demand.

In some embodiments, only one light source is employed. In other embodiments, multiple light sources of either the same color or different colors may be employed instead. In some embodiments, the light source is an LED. In other embodiments, the light source may be a laser, an incandescent light bulb, a fluorescent light bulb, or other light-producing device. Similarly, in some embodiments a single optical converter may be employed to produce a single tunable output wavelength. In other embodiments, multiple optical converters may be employed such that the MLE device emits light at a plurality of discrete, tunable wavelengths—something unachievable in the prior art.

The structure, composition, manufacture, and function of quantum dot particles generally are taught in U.S. Patent Application Publication No. 2003/0066998 by Lee et al., which is hereby incorporated by reference as though fully set forth herein. The structure, composition, manufacture, and function of exemplary quantum dot devices are taught in U.S. Pat. No. 5,889,288 to Futatsugi, which is hereby incorporated by reference as though fully set forth herein. The structure, composition, and manufacture of addressable quantum dot arrays are taught in U.S. Pat. No. 6,978,070 to McCarthy et al., which is hereby incorporated by reference as though fully set forth herein. Addressable quantum dots can be used as programmable dopants inside a material, to change its optical properties dynamically, and thus a plurality of quantum dots can be used to create reconfigurable bulk materials.

The quantum confinement layers, particles, wires, devices, or arrays employed in the MLE devices may be of different design than those described by Lee et al., Futatsugi, and McCarthy et al., but the operating principles are essentially the same. The MLE device reorganizes these principles or devices into a device for converting the output wavelength of a light source into any desired wavelength within a certain tunable multicolor range, selectable in real-time via external signals.

Other features, details, utilities, and advantages of the present invention will be apparent from the following more particular written description of various embodiments of the invention as further illustrated in the accompanying drawings and defined in the appended claims.

DETAILED DESCRIPTION OF THE INVENTION

The present invention is directed to the use of light-emitting devices (e.g., LEDs) and tunable optical converters to produce a tunable, multicolor light-emitting (MLE) optical device that is capable of producing light at any desired wavelength within a certain tunable multicolor range of the optical spectrum. For the purposes of this document, the term "optical" refers to visible, near infrared (IR), and near ultraviolet (UV) light which obey the normal rules of optics.

Figure 1:
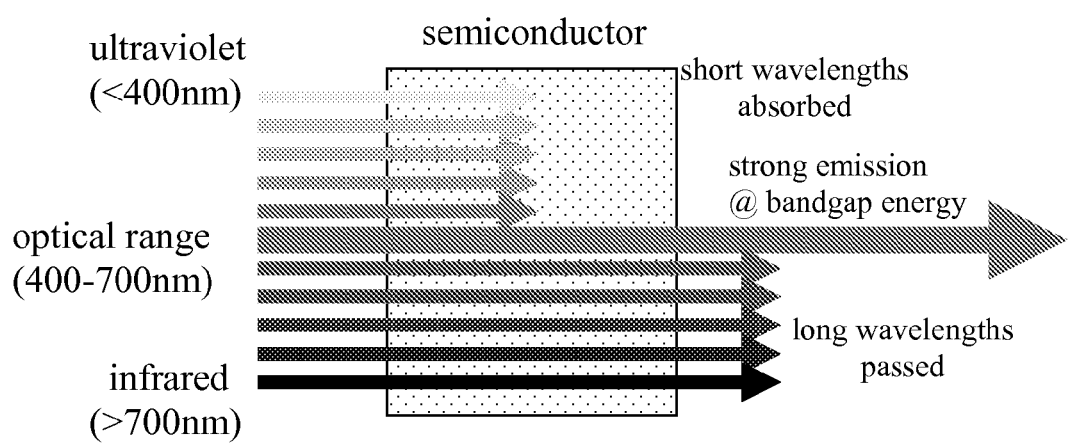
FIG. 1 illustrates the fluorescence of a piece of bulk semiconductor.

FIG. 1 is an illustration of the natural fluorescence effects of a block of semiconductor material. The block is generally transparent to photons at energies lower than the material's bandgap, absorbs photons at energies higher than the bandgap, and re-emits the absorbed energy at a wavelength corresponding to the bandgap energy. Thus, the material serves as a natural optical converter. However, the bandgap is a mildly temperature-sensitive quantity, so that the exact emission wavelength of the semiconductor changes as its temperature is varied.

Figure 2:
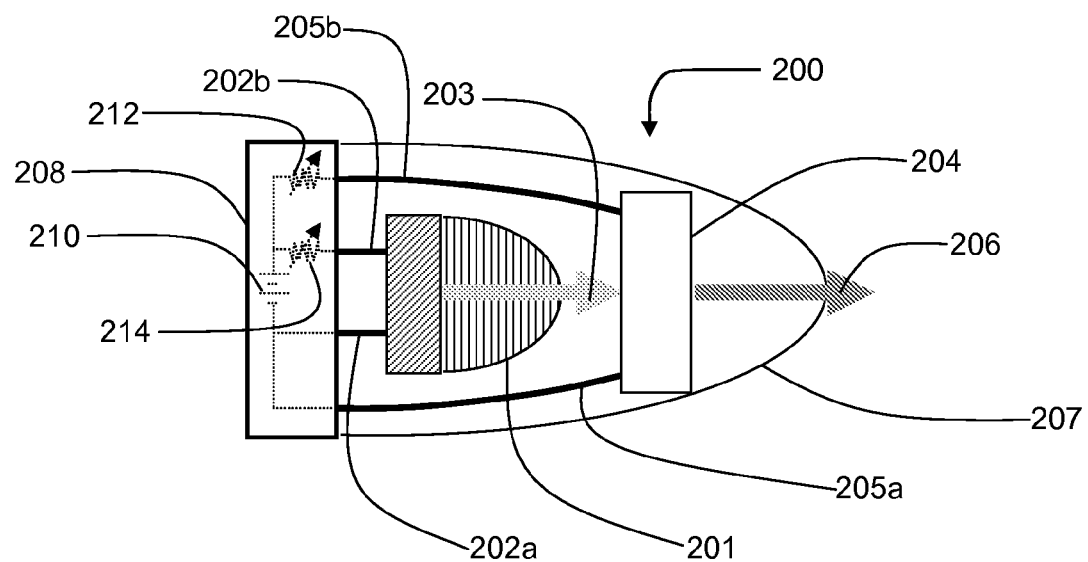
FIG. 2 is a schematic representation of an optical device in which the light source and optical converter are enclosed in a housing and attached to a control unit.

FIG. 2 is a schematic representation of an exemplary implementation of an MLE device 200. The MLE device 200 may comprise a light source 201 that produces short-wavelength light 203, which strikes a tunable optical converter 204 to stimulate the fluorescent emission of long-wavelength light 206. The exact wavelength of the emitted light 206 is determined by the state of the tunable optical converter 204. The light source 201 is activated by a control unit 208, to which it is connected by source wires 202a and drain wires 202b. The tunable optical converter 204 is also activated by the control unit 208, to which it is connected by a second set of source wires 205a and drain wires 205b. The entire assembly of the MLE device 200 may be enclosed in an optional transparent housing 207, which physically secures the parts against dislocation or breakage.

In one form, the light source 201 may be an ultraviolet LED. However, other light sources, including but not limited to LEDs of other colors, lasers, incandescent light bulbs, fluorescent light bulbs, halogen lights, arc lights, lime lights, and even candle flames could be used instead without altering the essential function of MLE device 200. Similarly, the tunable optical converter 204 may be any of a number of quantum confinement devices, for example, as depicted and described with respect to FIGS. 3A, 3B, 4, 5, and 6 herein. The long-wavelength light 206 emitted by the tunable optical converter 204 may be visible light or near-infrared light within a tunable emission range defined by the effective bandgaps of the optical converter 204 in its ground state and its most excited state. However, the device would still function normally if a different technology were employed to convert from one wavelength to another.

The control unit 208 may be a voltage source 210 (e.g., a battery, inverter, DC-DC converter, etc.) to which the source wire 202a and drain wire 202b of the light source 201 are connected by means of an on/off switch or dimmer switch 212 (e.g., a variable resistor or rheostat) internal to the control unit 208, and to which the source wire 205a and drain wire 205b of the tunable optical converter 204 are connected by means of a separate (i.e., parallel) dimmer switch 214 that regulates the quantum confinement voltage of the optical converter 204 and therefore regulates the bandgap and the range of emission wavelengths. The voltage of the voltage source 210 within the control unit 208 should be sufficient to drive both the light source 201 and the tunable optical converter 204. Driving both devices with a single voltage source 210 may thus require additional hardware, for example, resistors to step down the voltage or LRC circuits to regulate the voltage source 210. The control unit 208 may also include operator controls (e.g., knobs to adjust rheostat values), and/or an external signal receiver, e.g., a source and drain line having a potential difference proportional to the desired output wavelength of the tunable optical converter 204. By placing particular desired voltages across the source wire 202a and drain wire 202b of the light source 201 and the source wire 205a and drain wire 205b of the tunable optical converter 204, the wavelength of emitted light 206 can be varied. The functions of the control unit 208 may be performed by a huge variety of possible circuits, the operation of which is well understood in the prior art and the designs of which are well within the ability of one of ordinary skill in the art.

From the above description, the MLE device 200 can be seen to provide a capability which was previously not possible, namely, solid-state production of a monochromatic light output at any desired wavelength which be adjusted on demand, in real time, rather than at the time of manufacture. The tunable MLE device 200 may be used as a multifunctional, multicolored, programmable, general-purpose light source for virtually any application where other light sources were previously used. The tunable MLE device 200 combines in a single device the capabilities of a wide variety of static optical components. These capabilities are available on demand and many were difficult or impossible to achieve previously.

The MLE device 200 provides a solid-state tunable device that is capable of producing light at wavelengths that do not correspond to the ground-state bandgap energies of any naturally occurring or manmade semiconductor material. In addition, the MLE device 200 produce "true color" (e.g., orange) output of light at specified wavelengths instead of the optical illusion of color constructed from other discrete wavelengths (e.g., selected intensities of red, green, and blue) designed to fool the human eye. Thus, the MLE device 200 is capable of serving as a multifunctional replacement for bi-color, tri-color, and multi-colored LEDs, electroluminescent light sources, and RGB picture elements in video displays. The MLE device 200 can also serve as a multicolor light source, for example, as a multifunctional replacement for room lights and other static light sources or as a solid-state replacement for mechanical color-changing light sources such as those incorporating filter wheels (e.g., disco lights). In addition, a plurality of MLE devices 200 can be assembled using a plurality of independent external control signals to create a "true color" video display with uniquely realistic optical properties that could not be reproduced using prior technologies. Further, the MLE device 200 can be combined with other optical components (e.g., lenses, mirrors, half-mirrors, light sources, lasers, films, and gratings) to produce a wide variety of desired optical effects that either could not previously be done, could not be done in the solid state, or could not be done as conveniently.

Figure 3A:
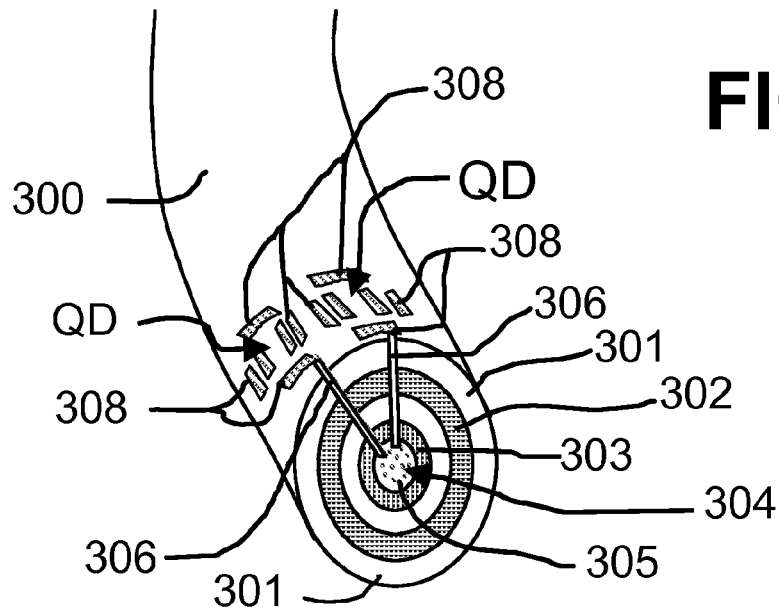
FIGS. 3A and 3B are schematic representations of one embodiment of a macroscopic, tunable, solid-state optical converter for use in the optical device of FIG. 2 comprising a multilayered microscopic fiber that includes a quantum well, surface electrodes, and control wires, which form quantum dot devices.
Figure 3B:
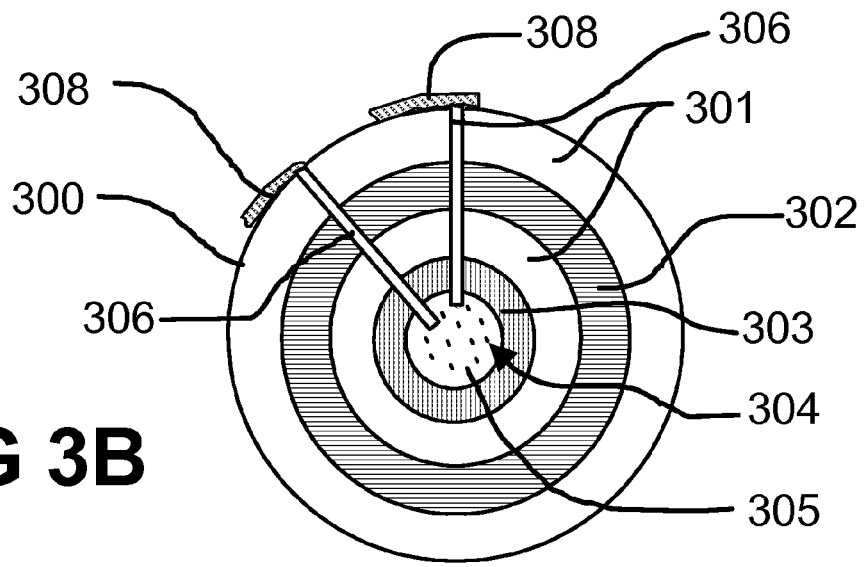

FIGS. 3A and 3B are schematic drawings of a macroscopic, tunable, solid-state optical converter for use in the MLE device of FIG. 2 in the form of a multilayered microscopic fiber 300. The fiber 300 includes a quantum well and surface electrodes 308, which form quantum dot devices, and control wires 304 to carry electrical signals to the electrodes. A plurality of these fibers may act as the macroscopic, tunable, solid-state optical converter. The control wires 304 may be contained in an insulating medium 355, surrounded by a quantum well, plus an optional memory layer 303. In one embodiment, the composition of the insulator 305 is a semiconductor oxide, although a variety of other materials could be used. The quantum well may be formed in a central or transport layer 302 of a semiconductor (similar to the negative layer of a P-N-P junction), for example, GaAs, surrounded by barrier or supply layers 301 of a semiconductor with higher conduction energy (similar to the positive layers of a P-N-P junction). Because of the difference in conduction energies, electrons "fall" preferentially into the lower energy of the transport layer 302, where they are free to travel horizontally (that is, within the layer) but are confined vertically (perpendicular to the layer) by the higher conduction energy of the barrier layers. However, the fiber 300 is not limited to this particular configuration, and may include quantum wells made from other materials and with other designs, as well as quantum wells designed to trap "holes" or other charge carriers.

The transport layer 302 of the quantum well must be smaller in thickness than the de Broglie wavelength of the charge carriers for the charge carriers to be confined within it. For an electron at room temperature, this would be approximately 20 nanometers. Thicker quantum wells are possible, although they will only exhibit quantum confinement of the charge carriers at temperatures colder than room temperature. Thinner quantum wells will operate at room temperature, and at higher temperatures so long as the de Broglie wavelength of the carriers does not exceed the thickness of the transport layer 302.

The surface of the fiber 300 may include conductors that serve as the electrodes 308 of the quantum dot device. These electrodes 308 confine charge carriers in the quantum well into a small space or quantum dot (QD) when a reverse-bias voltage is applied, since the negative charge on the electrodes 308 repels electrons, preventing their horizontal escape through the transport layer 302. The electrodes 308 may be powered by control wire branches 306 reaching to the surface of the fiber 300 from the control wires 304 in the center of the fiber 300. In one embodiment, the electrodes 308, control wires 304, and control wire branches 306 may be made of gold, although in principle they could be made of other metals, or other materials, such as semiconductors or superconductors.

Once the charge carriers are trapped in a quantum dot (QD), they form an artificial atom that is capable of serving as a dopant. Increasing the voltage on the electrodes 308 by a specific amount forces a specific number of additional charge carriers into the quantum dot (QD), altering the atomic number of the artificial atom trapped inside. Conversely, decreasing the voltage by a specific amount allows a specific number of carriers to escape to regions of the transport layer 302 outside the quantum dot (QD). In the embodiment of FIG. 3A, six electrodes 306 are provided for each quantum dot (QD), although more or less could be used. By selecting the voltages applied to these electrodes 308 it is possible to alter the repulsive electric field, thus affecting size and shape of the quantum dot (QD) confinement region. Changes to the confinement region similarly alter the size and shape of the artificial atom trapped inside the quantum dot (QD), either in conjunction with changes to the artificial atom's atomic number or while holding the atomic number constant. Thus, the doping properties of the artificial atom are adjusted in real time through variations in the signal voltage of the control wires 304 at the center of the fiber 300.

There are various possibilities for making the multilayered microscopic fiber 300 of different materials, and in different configurations. The most advantageous configurations are the smallest, since smaller quantum dots can contain charge carriers at higher energies (shorter de Broglie wavelengths) and thus display atom-like behavior at higher temperatures. One exemplary fiber 300 would be similar in design to a single-electron transistor, although molecules the size of benzene rings or smaller, if employed as quantum dot particles, will be unable to hold large numbers of excess charge carriers. This limits their usefulness in generating artificial atoms. A somewhat larger but more practical design is to employ electrically conductive nanotubes, such as a carbon nanotubes, as the control wire segments 304, and fullerene-type molecules, such as carbon fullerenes, as the quantum dot devices.

Figure 4:
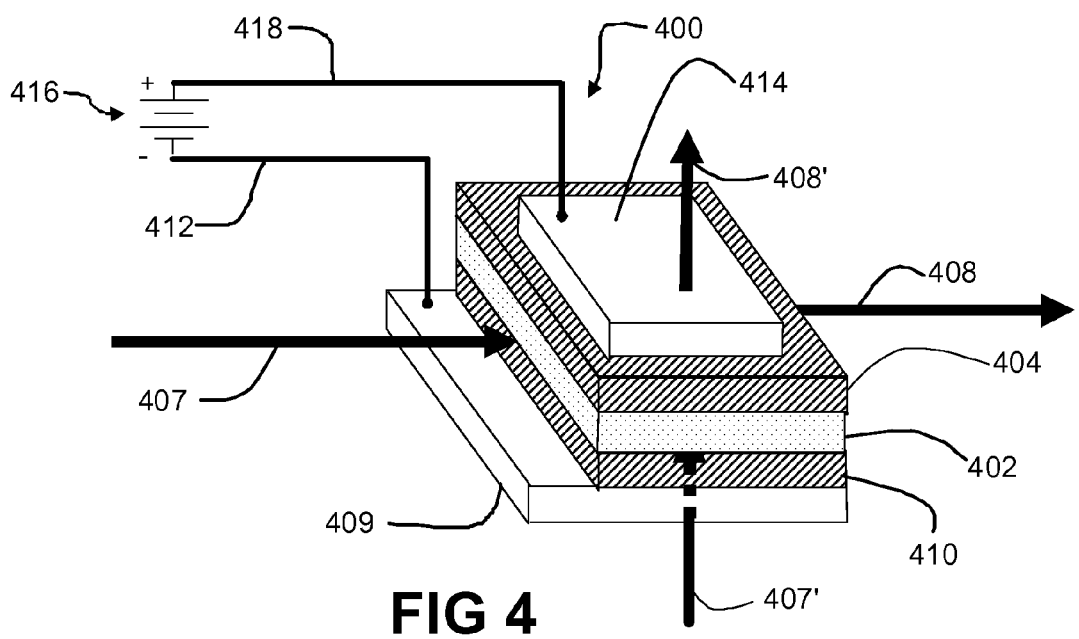
FIG. 4 is a schematic representation of another embodiment of a of a tunable, solid-state optical converter for use in the optical device of FIG. 2 comprising a quantum well to confine charge carriers in a two-dimensional layer, and an electrode to create an electric field across the quantum well to alter its quantum confinement properties via the Stark effect.

FIG. 4 illustrates tunable, solid-state optical converter for use in the MLE device of FIG. 2 in the form of a quantum confinement device 400 that relies on the quantum-confined Stark effect. The device 400 comprises an upper barrier layer 404, a lower barrier layer 410, a transport layer 402, a surface electrode 414 controlled by a control path 418, and a ground plane 409. Electrons or other carriers are confined in the vertical dimension by the barrier layers 404 and 410 of the quantum well, producing quantum confinement carrier behavior in that dimension and thus altering the effective bandgap of the quantum well. When the control path 418 is activated by an external voltage source 416, the ground plane 409 then drains to the negative side of the voltage source through the control return path 412. The resulting potential across the quantum well affects the quantum confinement energy of the trapped carriers, via the quantum Stark effect. This alters the effective bandgap and thus the emission wavelength of the transport layer 402, particularly in the vertical direction, and thus allows the transport layer 402 to serve as a tunable optical converter. Two possible paths 407, 407' are shown for incoming light along with two possible output paths 408, 408' for outgoing (emitted) light along respective axes. In some implementations the light source and the quantum confinement device 400 may not be aligned on a single axis so that, for example, light from a single source may be directed (e.g., via optics) to different quantum confinement devices 400.

Figure 5:
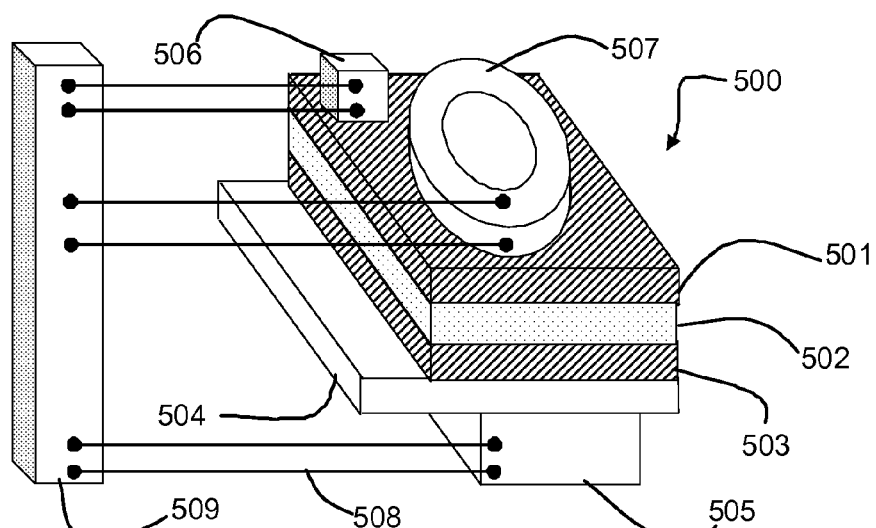
FIG. 5 is a schematic representation of a further embodiment of a tunable, solid-state optical converter for use in the optical device of FIG. 2 comprising a thermochromic quantum well surrounded by barrier layers, as well as a solid-state heater, thermoelectric cooler, and thermostat for controlling the filter's temperature.

FIG. 5 is a schematic representation of a tunable, solid-state optical converter for use in the MLE device of FIG. 2 in the form of a thermochromic fluorescent filter 500, for example, incorporating a thermochromic quantum well, along with apparatus for controlling the temperature of the quantum well and therefore the bandgap. The thermochromic fluorescent filter 500 includes barrier layers 501 and 503 surrounding a well layer 502, with a transparent substrate layer 504 providing structural support. In addition, attached to the thermochromic fluorescent filter 500 are a heating device 505, a temperature sensor 506, and a cooling device 507.

The heating device 505, cooling device 507, and temperature sensor 506 are connected by wires 508 to a temperature-regulating unit 509, which reads the temperature of the quantum well and adjusts the output of the heating device 505 or cooling device 507 in response to this temperature data in order to keep the quantum well at a particular desired temperature, and thus a particular cutoff wavelength. In one embodiment, the temperature-regulating unit 509 may be a solid-state thermostat or thermal control circuit.

Figure 6:
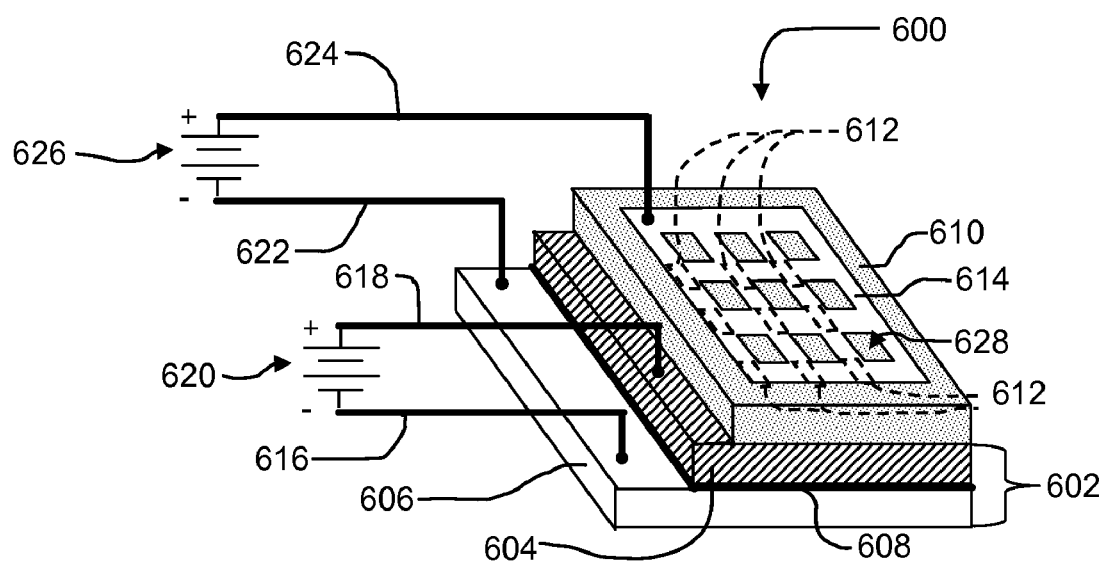
FIG. 6 is a schematic representation of yet another embodiment of a of a tunable, solid-state optical converter for use in the optical device of FIG. 2, which uses a nonuniform electric field to divide a quantum well into an array of quantum dots by means of a charged, grid-shaped electrode.

FIG. 6 is a schematic representation of a tunable, solid-state optical converter for use in the MLE device of FIG. 2 in the form of an arbitrary number of quantum dots 612 in a layered composite film 600. The film 600 is composed of an insulating layer 610, a transport layer 604, and a barrier layer 606. The transport layer 604 and the barrier layer 606 together form a heterojunction 602. Two independent voltages 620, 626 and four control wires 616, 618, 622, 624 produce potentials across the entire film 600 and the heterojunction 602, respectively. A metal film on top of the insulating layer 610 may be fashioned into a grid electrode 614 with multiple openings 628. If the openings 628 are smaller than or comparable to the de Broglie wavelength of the confined carriers, then quantum confinement effects will be observed when the heterojunction 602 and the surface electrode 614 are charged. Specifically, one quantum dot 612 is formed in the gas layer 608 between the transport layer 604 and the barrier layer 606 beneath each opening 628 in the grid electrode 614. Thus, a plurality of artificial atoms are created in the layered composite film 600 corresponding to each opening 628 in the grid electrode 614. Because this alters the effective bandgap of the material, this device is once again capable of serving as a solid-state, tunable optical frequency converter.

Although the description above contains many specificities, these should not be construed as limiting the scope of the invention but rather construed as merely providing illustrations of certain exemplary embodiments of this invention. There are various possibilities for making the tunable MLE device of different materials, and in different configurations. A number of optional components may also be added, including air gaps or vacuum gaps, transparent substrates or spacer materials, adhesives, mounting brackets, antireflection coatings, lenses, gratings, polarizers, parabolic mirrors, and static (i.e., non-tunable) optical filters or reflectors.

Numerous other variations exist which do not affect the core principles of the operation of the MLE device. For example, the optical converter may be oriented at an angle to the incoming light stream, it may be mounted such that it can be mechanically reoriented, or it may be fitted with adjustable gratings or other components such that it behaves optically as though it were rotated. Furthermore, in any MLE device incorporating a quantum well, the quantum well can be replaced by a layer or arrangement of quantum wires or quantum dot particles, whether spherical or otherwise, without altering the essential functioning of the MLE device except by altering the ground-state and excited-state confinement energies of the optical converter and thus the emission wavelength. In addition, while devices are described in this specification that vary the quantum confinement energy of trapped carriers by means of temperature and electric fields, other mechanisms for varying the effective bandgap and/or the output wavelength of an optical converter are also possible, including magnetic fields (as in a Penning trap), electromagnetic fields (as in laser cooling), piezoelectric effects (as in a ceramic stereo speaker), and mechanical effects that alter the properties of a crystal by deforming it. Such arrangements are explicitly included as embodiments of the present invention.

Although various embodiments of this invention have been described above with a certain degree of particularity, or with reference to one or more individual embodiments, those skilled in the art could make numerous alterations to the disclosed embodiments without departing from the spirit or scope of this invention. It is intended that all matter contained in the above description and shown in the accompanying drawings shall be interpreted as illustrative only of particular embodiments and not limiting. All directional references e.g., proximal, distal, upper, lower, upward, downward, left, right, lateral, front, back, top, bottom, above, below, vertical, horizontal, clockwise, and counterclockwise are only used for identification purposes to aid the reader's understanding of the present invention, and do not create limitations, particularly as to the position, orientation, or use of the invention. Connection references, e.g., attached, coupled, connected, and joined are to be construed broadly and may include intermediate members between a collection of elements and relative movement between elements unless otherwise indicated. As such, connection references do not necessarily imply that two elements are directly connected and in fixed relation to each other. Changes in detail or structure may be made without departing from the basic elements of the invention as defined in the following claims.

What is claimed is:

1. An optical device that emits monochromatic light of a wavelength tunable within a multicolor range comprising
   a light source that emits light at a short wavelength;
   a thermochromic fluorescent filter comprising a quantum confinement device that converts the short-wavelength light to a long wavelength within the multicolor range and emits the long-wavelength light;
   a heating device coupled with the thermochromic fluorescent filter;
   a cooling device coupled with the thermochromic fluorescent filter;
   a temperature sensor coupled with the thermochromic fluorescent filter; and
   a temperature regulating unit connected to each of the heating device, the cooling device and the temperature sensor, wherein the temperature regulating unit receives temperature data from the temperature sensor and sends control signals to the heating device and the cooling device to adjust the temperature of the thermochromic fluorescent filter and thereby select the wavelength of the long-wavelength light within the multicolor range.

2. The optical device of claim 1, wherein the quantum confinement device has an emission range of the long-wavelength light determined by an effective bandgap in a ground state and in a state of maximum excitation that bound the multicolor range.

3. The optical device of claim 1, wherein the light source is a light-emitting diode.

4. The optical device of claim 1, wherein the light source is a monochromatic source.

5. The optical device of claim 1, wherein the light source is a polychromatic source.

6. The optical device of claim 1, wherein the light source and the thermochromic fluorescent filter are aligned along an axis.

7. The optical device of claim 1, wherein
the light source and the thermochromic fluorescent filter are aligned along separate axes; and
the optical device further comprises optics to direct the short-wavelength light to the thermochromic fluorescent filter.

8. A method for producing a monochromatic light, adjustable in real time, from a single light source, the method comprising
emitting light from the single light source at a short wavelength;
converting the short-wavelength light to a long wavelength within a multicolor range using a thermochromic fluorescent filter comprising a quantum confinement device, wherein the multicolor range is bounded by an effective bandgap in a ground state and in a state of maximum excitation of the quantum confinement device;
receiving temperature information from the thermochromic fluorescent filter;
heating and cooling the thermochromic fluorescent filter to select a wavelength of the long-wavelength light within the multicolor range; and
emitting the long-wavelength light.

\* \* \* \* \*